United States Patent [19]
Carlson et al.

[11] 4,449,164
[45] May 15, 1984

[54] ELECTRONIC MODULE COOLING SYSTEM USING PARALLEL AIR STREAMS

[75] Inventors: Douglas M. Carlson, Anoka, Minn.; Randall L. Ohman, San Antonio, Tex.; Lloyd M. Thorndyke, Edina, Minn.

[73] Assignee: Control Data Corporation, Minneapolis, Minn.

[21] Appl. No.: 424,824

[22] Filed: Sep. 27, 1982

[51] Int. Cl.³ .................................................. H05K 7/20
[52] U.S. Cl. .................................. 361/384; 165/126; 174/16 R
[58] Field of Search ............... 357/81, 82; 174/16 R, 174/16 HS; 361/381, 382, 383, 384, 386; 165/122, 126, DIG. 11

[56] References Cited

U.S. PATENT DOCUMENTS

| | | | |
|---|---|---|---|
| 2,380,026 | 7/1945 | Clark | 175/366 |
| 3,198,990 | 8/1965 | Katzin | 317/100 |
| 3,790,859 | 2/1974 | Schraeder et al. | 317/100 |
| 4,103,737 | 8/1978 | Perkins | 165/80 |
| 4,158,875 | 6/1979 | Tajima et al. | 363/384 |
| 4,277,816 | 7/1981 | Dunn | 361/384 |
| 4,296,455 | 10/1981 | Leaycraft et al. | 361/383 |

OTHER PUBLICATIONS

"Jet Cooling... Devices," IBM Tech. Discl. Bull., vol. 20, No. 9, Feb. 1978, Keller & Moran, pp. 3575, 3576.

*Primary Examiner*—G. P. Tolin
*Attorney, Agent, or Firm*—Edward L. Schwarz; Joseh A. Genovese

[57] ABSTRACT

The cooling of electronic modules on a circuit board is improved by the use of heat sinks comprising a plurality of longitudinal fins projecting from the modules. Individual tubes communicating with an air plenum fit around and part way along each heat sink. Air drawn from or forced into the plenum causes air flow within the tubes and along the fins to cool them and the modules to which they are attached.

9 Claims, 3 Drawing Figures

ELECTRONIC MODULE COOLING SYSTEM USING PARALLEL AIR STREAMS

BACKGROUND OF THE INVENTION

The cooling of high power electronic modules carried on a circuit board has always been a troublesome problem. It is possible to use a liquid coolant pumped through pipes in contact with a heat sink to remove the heat they generate. However, such an approach requires relatively complex tubing and the expense of an external chiller to accept the heat carried by the coolant. It is therefore desirable to use ambient air to cool these modules. Because the high heat generation of such modules makes free convective cooling insufficient, forced convective cooling is necessary.

Forced convective cooling has the advantages of simplicity and cost effectiveness. Because of the typical layout of circuit boards and the modules carried by them, the usual procedure is to introduce air at one edge of the circuit board and force it across the many modules carried on the board to cool them. However, the air which passes near the first modules is heated, lessening its ability to cool those modules which it encounters later as it flows around them. Therefore, there have been attempts made to implement so-called "parallel" cooling or air flow, where air is distributed to the modules involved before it has been warmed by any other of the modules. These designs, however, cannot always transfer enough heat to the air passing by them to keep the temperature of the module within the safe region.

PRIOR ART STATEMENT

U.S. Pat. No. 4,296,455 teaches the use of tubes attached to a module through which air is blown in a parallel mode from a plenum. U.S. Pat. No. 2,380,026 discloses plates located in the mouths of ducts through which air is forced from a common source. U.S. Pat. No. 3,198,990 shows a honeycomb structure having heat producing electronic elements inserted in individual cells, each element having axial leads to which interconnecting wires are connected. Air is blown through the honeycomb structure to directly cool the elements. U.S. Pat. Nos. 4,158,875; 3,790,859; and 4,103,737 show other approaches to cooling of electronic components.

BRIEF DESCRIPTION OF THE INVENTION

To solve the problems mentioned above, this cooling structure includes an individual heat sink assembly for each module with high enough heat transfer characteristics so that the typical module dissipating 1-5 watts can be easily cooled with ambient air flow. A heat sink which has longitudinal fins of high thermal conductivity joined at a central axis is attached in intimate thermal contact at one end, to each electronic module. Each heat sink projects substantially perpendicularly from the circuit board. An air plenum having an air guiding side preferably shaped to conform to the contour of the circuit board is supported in spaced apart relation from the side of the circuit board on which the heat sinks are mounted. The air guiding side has a plurality of hollow tube sections which communicate with the interior of the plenum. Each tube extends toward and partially encloses one heat sink. The end of each tube section is substantially sealed to the air guiding side of the air plenum, so that no air can leak from the plenum between the air guiding side and the individual tubes. A fan or other air pump either blows air into the plenum or draws air from the plenum so as to cause air to rush along the fins of the individual heat sinks, thereby cooling them. Since relatively rapid air flow over a large heat sink area occurs, heat transfer from the fins to the air stream is relatively efficient. The air so heated is simply ejected to the atmosphere. No heat sink depends for its cooling on air which has already passed by another heat sink.

Accordingly, one purpose of this invention is to eliminate the possibility of hot spots within an electronic chassis.

Another purpose is to permit sources of relatively large amounts of heat to be packed with densities higher than previously was possible when employing ambient air cooling.

Another purpose is to standardize the amount of heat which is removable from an individual electronic module.

Still another purpose is to maintain all the modules of similar heat dissipation on a circuit board at very nearly the same temperature, independent of variations in temperature of other modules.

Other purposes and effects of this invention will be apparent from the detailed description which follows.

DESCRIPTION OF THE PREFERRED EMBODIMENT

Figure 1:
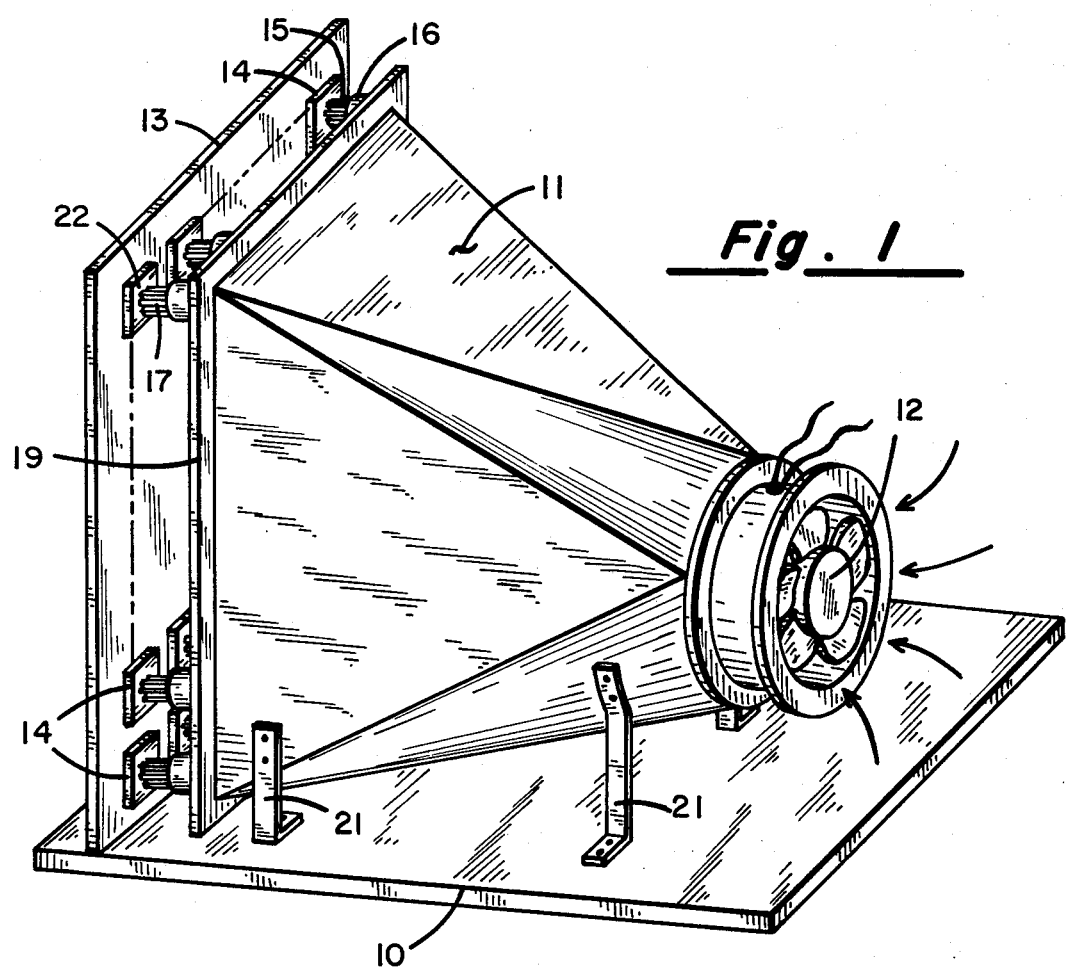
FIG. 1 shows an electronic circuit board assembly employing the cooling structures of this invention.

Turning first to the structure shown in FIG. 1, a flat circuit board 13 contains on one side a series of electronic modules 14. These may be placed in the rectangular grid pattern shown, or have a more irregular arrangement. Circuit board 13 contains the interconnections between the various modules 14. Circuit board 13 is mounted on a base or chassis 10. The structure within each module 14 must efficiently transport heat generated by the heat generating elements within module 14 to a heat sinking surface 22 of module 14 so that the heat can be removed in some fashion. A heat sink 15 is attached at one of its ends in intimate thermal contact with the heat sinking surface 22 of module 14. Heat sink 15 projects from surface 22 preferably perpendicularly to circuit board 13.

Figure 2:
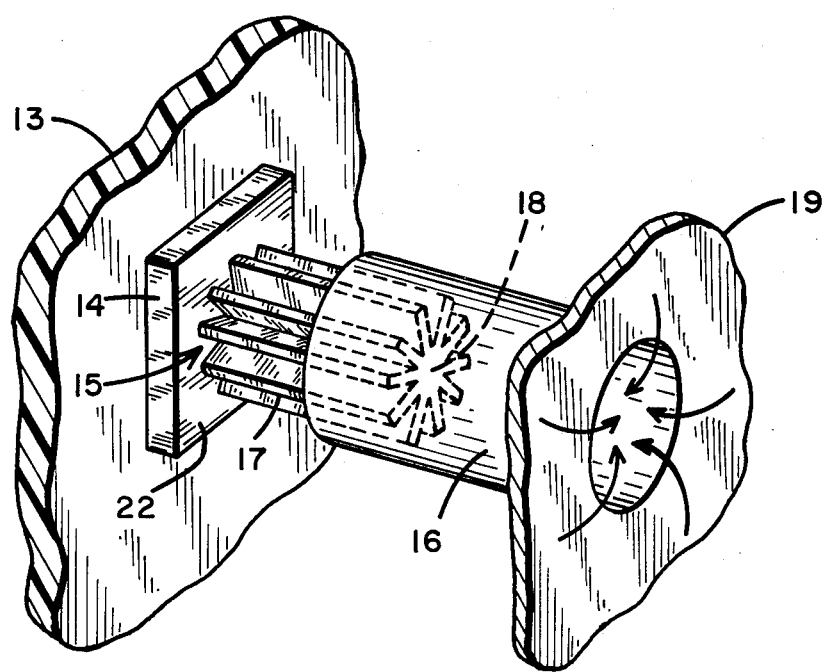
FIG. 2 is a detailed perspective drawing of one of the cooling structures shown in FIG. 1.

In FIG. 2, the heat sink 15 is shown in greater detail. It preferably comprises a plurality of axially oriented fins 17 projecting perpendicularly from module 14 and board 13, all of which intersect at a center 18. It is important that the ends of all the fins be in intimate thermal contact with the heat sinking surface 22 of module 14.

Figure 3:
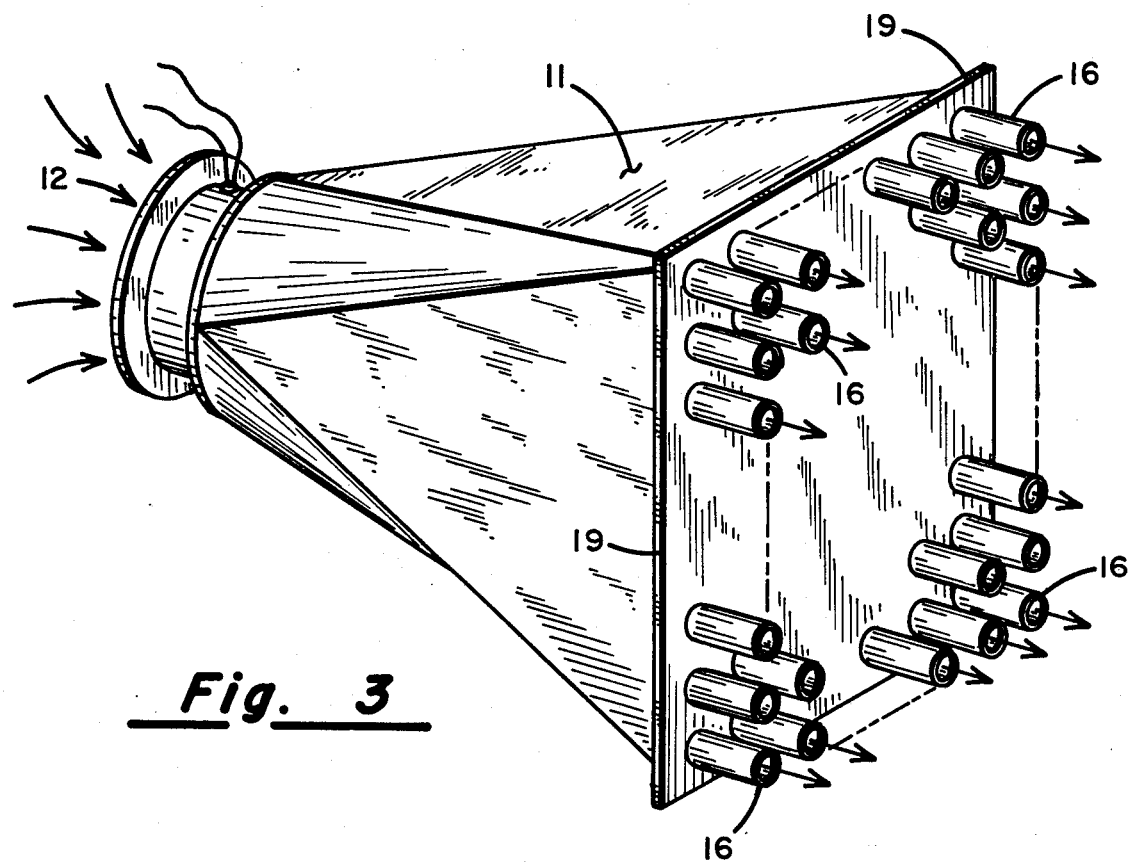
FIG. 3 is a perspective drawing of the plenum and the outside of its air guiding side.

The air plenum 11 shown in FIG. 1, has an air guiding side 19 (shown in FIG. 3) facing the heat sinking surfaces 22 of modules 14. A part of this air guiding side 19 is also shown in greater detail in FIG. 2. Side 19 is generally shaped to conform to the contour of circuit board 13 and thus is flat in this example, and is held by plenum 11 in facing, spaced apart relationship with the side of the circuit board 13 carrying the heat sinks 15. Plenum 11 is in turn carried by supports 21 on base 10. A fan or blower 12 in a side of plenum 11 creates a pressure difference between the interior of plenum 11 and the ambient. Air guiding side 19 need not conform to the contour of circuit board 13, but the structure is easier to design and is more compact if this is the case.

Air guiding side 19 includes a plurality of tube sections 16 each of which communicate with the interior of plenum 11. Each tube section 16 extends toward and partially encloses one of the heat sinks 15. Each tube section 16 is substantially sealed to the air guiding side 19, so that air which is drawn into or expelled from plenum 11 by fan 12 is caused to flow only through the pie- or V-shaped channels created between fins 17 and the interior surface of each tube section 16. For best operation each tube section 16 free end should be spaced from its associated heat sinking surface 22 such that the open circumferential area of heat sink 15 between the end of the tube section 16 enclosing it and the surface 22 at its base, is at least equal to the internal cross sectional area of tube 16 less the solid cross sectional area of sink 15, both cross sections being taken perpendicular to tube 16's axis. If this circumferential area is less than this cross sectional area difference, air flow through tube 15 will be restricted, causing reduced heat transfer, partially enclose heat sinks 15. If heat sinks 15 are completely enclosed, then air cannot escape from or enter the channels between fins 17. At any rate, the tube sections 16 must enclose at least about 1/10th of the lengths of heat sinks 17 if fan 12 creats positive pressure within plenum 11. If fan 12 creates negative pressure within plenum 11, tubes 16 must enclose a large fraction of sinks 15. It does not appear that heat transfer between surfaces 22 and sinks 15, and the air streams is particularly sensitive to direction of air flow as long as the tubes 16 enclose the preferred lengths of sinks 15. Probably the fact that air flow from plenum 11 causes air to directly impinge on heat sinking surfaces 22 is approximately balanced by the greater efficiency of heat transfer between the unheated air stream and the relatively hotter bases of sinks 15.

It is obvious that a wide variety of designs can be employed for the heat sinks 15 and the tube sections 16 which enclose them. For example, the center 18 might be a flat plate projecting from surface 14 with fins projecting in turn at angles from it, and whose ends define a rectangular or square pattern. However, experimentation shows that the best design now known is that shown in FIG. 2. Fins 17 project radially from a center portion 18 where fins 17 intersect, and form between individual fins 17 channels which have pie- or V-shaped cross sections. Heat sinks 15 can be easily made as aluminum extrusions.

It is possible that irregularities in the tube sections 16 at the point where air enters them will induce turbulent flow and increased heat transfer. Of course, this will also increase flow resistance, necessitating added capacity for fan 12. This is a design consideration for one wishing to practice this invention.

It is known that the amount of heat transferred between a moving air stream and a heat source is dependent on the air velocity, the area of the source, and the temperature difference between the heat source and the air itself. In the conventional series parallel cooling arrangement, air velocity must be quite high to keep the air temperature rise from being so great that downstream module temperature is too high. High velocity air streams are noisy and the fans which create them are expensive. The high air velocity and large total heat transfer air over which the air flows does allow cooling in many cases, however.

The instant invention takes a different approach. A very high efficiency heat exchanger permits maximum heat absorption by the air stream with totally parallel air flow. The high efficiency is a result of the air being constrained by the tube sections 16 to flow only in close proximity to the heat sinks 15, and by the very large heat sink area. Because the total cross sectional area of the air passages within tube sections 16 is very great and quite short, low fan pressure is sufficient to generate adequate air flow. Low air speed is sufficient, allowing extremely quiet operation and use of small, inexpensive, low power fans. Thus, this invention provides substantial advantages over the past designs.

The preceding describes the invention.

What is claimed is:

1. In an assembly comprising a base, a circuit board mounted thereon, and a plurality of heat-generating electronic modules mounted on a side of the circuit board, an improved means for cooling the modules, comprising
    (a) a plurality of heat conductive heat sinks each comprising a plurality of fins projecting from the circuit board, each heat sink attached in intimate thermal contact at one end to an electronic module;
    (b) an air plenum mounted on the base having an air guiding side in facing, spaced apart relation with the side of the circuit board on which the heat sinks are mounted, said air guiding side including a plurality of tube sections communicating with the plenum's interior, each extending toward and partially enclosing a heat sink, the exterior of each tube section being substantially sealed to the air guiding side; and
    (c) means for creating an air pressure in the plenum different from the ambient.

2. The assembly of claim 1, wherein a heat sink comprises a plurality of fins projecting axially from a central stem.

3. The improvement of claim 1, wherein each heat sink is shaped to closely fit within the tube sections enclosing it.

4. The improvement of claim 1, wherein each tube section encloses a fraction of the heat sink creating an open circumferential area at the base of the heat sink at least equal to the internal cross sectional area of the tube section less the solid cross sectional area of the heat sink, both said cross sections being taken perpendicular to the tube section's axis.

5. The improvement of claim 1, wherein each tube section encloses at least about 1/10th of the length of the associated heat sink, and the air pressure difference creating means creates positive pressure within the plenum.

6. The improvement of claim 1, wherein the tube sections are integral with the air guiding side.

7. The improvement of claim 1, wherein each heat sink comprises high heat conductive metal.

8. The improvement of claim 5, wherein each heat sink closely fits within the tube section enclosing it.

9. The improvement of claim 8, wherein each tube section encloses the amount of the heat sink which creates an open circumferential area at the base of the heat sink at least equal to the internal cross sectional area of the tube section less the solid cross sectional area of the heat sink, both said cross sections being taken perpendicular to the tube section's axis.

* * * * *